(12) United States Patent
Cheah et al.

(10) Patent No.: US 7,884,470 B2
(45) Date of Patent: Feb. 8, 2011

(54) SEMICONDUCTOR PACKAGES WITH STIFFENING SUPPORT FOR POWER DELIVERY

(75) Inventors: Kee Leong Cheah, Padang Serai (MY); Eu Soon Lee, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/317,434

(22) Filed: Dec. 23, 2008

(65) Prior Publication Data

US 2010/0155927 A1    Jun. 24, 2010

(51) Int. Cl.
*H01L 23/34* (2006.01)

(52) U.S. Cl. .................. 257/724; 257/691

(58) Field of Classification Search .......... 257/723, 257/724, 516, 528, 532, 691
See application file for complete search history.

(56) References Cited

U.S. PATENT DOCUMENTS

| | | | |
|---|---|---|---|
| 6,672,912 B2 * | 1/2004 | Figueroa | 439/862 |
| 6,811,410 B2 * | 11/2004 | Figueroa et al. | 439/68 |
| 2001/0006457 A1 * | 7/2001 | Fujino | 361/761 |
| 2002/0074653 A1 * | 6/2002 | Khandros et al. | 257/724 |

* cited by examiner

*Primary Examiner*—S. V Clark
(74) *Attorney, Agent, or Firm*—John N. Greaves

(57) ABSTRACT

Embodiments of the invention relate to semiconductor packages in which electrical power is delivered to die-side components removably installed in sockets formed between a package stiffener and an electrical conductor. To this purpose, the package stiffener and the electrical conductor may be electrically coupled to the power and ground terminals of the semiconductor package.

10 Claims, 4 Drawing Sheets

US 7,884,470 B2

SEMICONDUCTOR PACKAGES WITH STIFFENING SUPPORT FOR POWER DELIVERY

BACKGROUND

1. Technical Field

Embodiments of the invention relate to semiconductor packages with stiffening support to provide line sockets for power delivery to electrical components installed in the sockets, and methods of fabricating semiconductor packages.

2. Description of Related Art

FIG. 1 is a cross-sectional view of a thin semiconductor package 100 built upon a coreless substrate 102 on which a package stiffener 104 is mounted on a periphery of the substrate 102 to provide stiffening support to the thin semiconductor package. Die side capacitors 106 may be arranged between a semiconductor die 108 and the stiffener 104 to deliver electrical power to the die 108 as and when required, e.g., when on-die capacitors are fully discharged. Die-side capacitors 106 are typically are soldered onto the substrate 102 which makes removal difficult.

A potential to reduce a distance ($XX_1$) between the semiconductor die 108 and the package stiffener 104 is limited by the underfill materials 110, solder materials 112 provided to the die 108 and the die-side capacitor 106 respectively. In practice, both the underfill materials 110 and solder materials 112 should be spaced apart at least by a keep-out zone distance ($X_1$) to reduce the risk of package or die side capacitors breakage due to thermal cycling effects of the underfill materials 110 and solder materials 112 which have different coefficients of thermal expansion (CTE). Further, a keep-out zone ($X_2$) is also maintained between the stiffener 104 and the capacitor solder 112. The distance ($XX_1$) between the semiconductor die 108 and the package stiffener 104, however, poses a severe limitation to reducing an overall package size ($XX_2$) and yet translates into higher overall costs due to additional substrate area needed by the coreless substrate 102 to accommodate both the stiffener 104 and die side capacitors 106.

DETAILED DESCRIPTION OF ILLUSTRATIVE EMBODIMENTS

Figure 1:
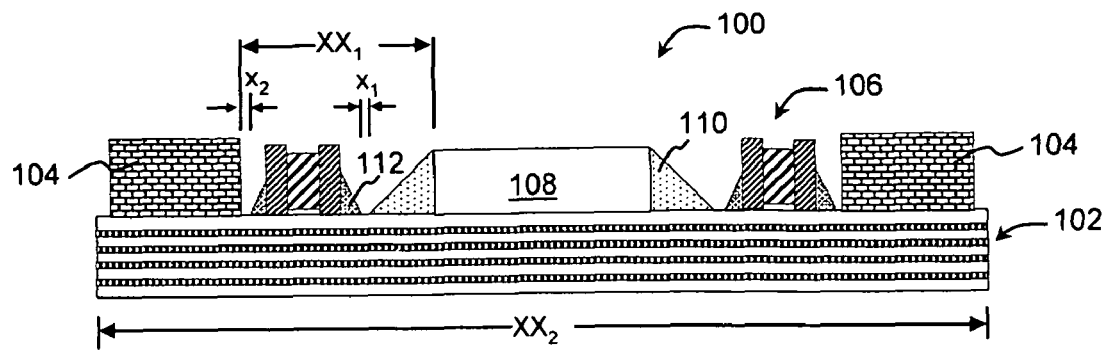
FIG. 1 is a cross-sectional view of a conventional semiconductor package.

In the following description, numerous specific details are set forth in order to provide a thorough understanding of various illustrative embodiments of the invention. It will be understood, however, to one skilled in the art, that embodiments of the invention may be practiced without some or all of these specific details. In other instances, well known process operations have not been described in detail in order not to unnecessarily obscure pertinent aspects of embodiments being described. In the drawings, like reference numerals refer to same or similar functionalities or features throughout the several views.

Figure 2A:
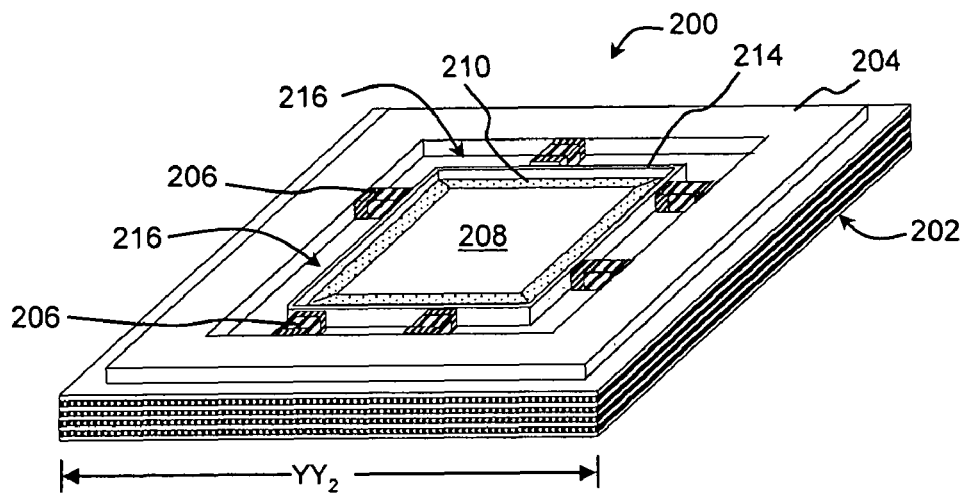
FIG. 2A is a perspective view of a semiconductor package according to one embodiment of the invention.
Figure 2B:
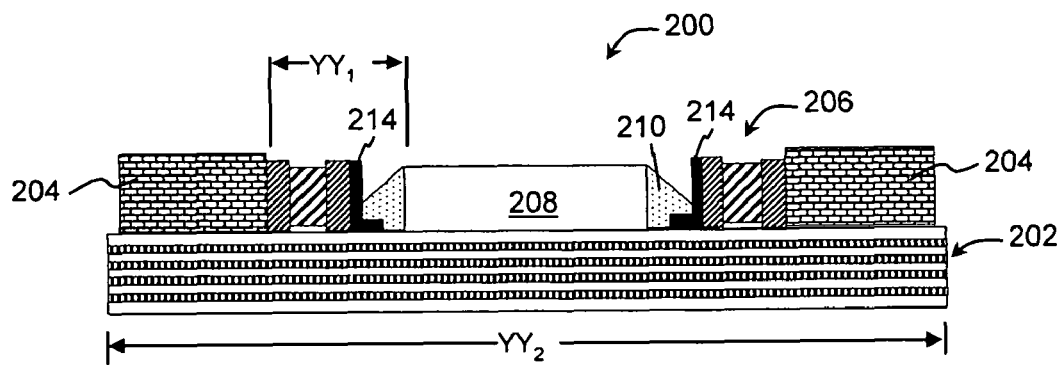
FIG. 2B is a cross-sectional view of the semiconductor package of FIG. 2A.

Reference is made to FIGS. 2A and 2B illustrating a perspective view of a semiconductor package 200 according to one embodiment of the invention. The package 200 may employ a coreless substrate 202 which may be formed of several build-up layers fabricated using known processes. A semiconductor die 208 or an integrated chip may be mounted or soldered onto the substrate 202 in a die-mounting zone using known processes, e.g. solder process. An underfill material 210, e.g. epoxy, may be provided between the semiconductor die 208 and the substrate 202 to provide mechanical support to the die 208 and to protect the die 208 from the environment. A package stiffener 204 may be mounted at least partially along a perimeter of the substrate 202 to provide stiffening support to the coreless substrate 202. The package stiffener 204 (hereinafter as "first electrical conductor") should possess good electrical conductivity, sufficient stiffness and should yet be moldable into desired shapes. Examples of suitable materials for the package stiffener 204 include, but are not limited to, copper, aluminum, a metal alloy, and any combinations thereof. The package stiffener 204 is illustrated in FIG. 2A as having a square shape but it should be understood that other shapes and arrangements may be suitable (see FIGS. 6B, 7A to 7C which will be described in later paragraphs).

In FIGS. 2A and 2B, interposed between the semiconductor die 208 and the first electrical conductor 204 is a second electrical conductor 214 mounted on the substrate 202. Examples of a suitable material for the second electrical conductor 214 include, but are not limited to, copper, aluminum, a metal alloy and any combinations thereof. The second electrical conductor 214 is suitably spaced apart from the first electrical conductor 204 to form a socket 216 therebetween. More particularly, the spacing between the first and the second electrical conductor 204, 214 is suitably dimensioned to receive at least a die-side component 206, e.g. die side capacitor, therebetween. The arrangement of the first and the second electrical conductors 204, 214 may be parallel to each other if required. Installation of the die-side components 206 may be by direct insertion, such as by a manual or an automatic pick and placement tool. Once the die-side component 206 is installed in the socket 216, the component 206 is maintained in electrical contact with the first and the second electrical conductors 204, 214. The second electrical conductor package stiffener 204 is illustrated in FIG. 2A as having a square shape but it should be understood that other shapes and arrangements may be suitable (see FIGS. 6B, 7A to 7C which will be described in later paragraphs).

The first and the second electrical conductors 204, 214 are electrically coupled to a power terminal ($V_{cc}$) and a ground terminal ($V_{ss}$) of the package 200. This may be achieved by soldering (or by other equivalent methods) the first and the second electrical conductors 204, 214 to appropriate connectors on the substrate 202 to electrically couple to the power and ground terminals. The first and the second electrical conductors 204, 214 should be coupled to terminals having different polarities to allow the installed die-side component 206 draw electrical power when installed in the socket 216. In some embodiments, the first electrical conductor 204 is electrically coupled to the power terminal while the second electrical conductor 214 is electrically coupled to the ground terminal. In other embodiments, the first electrical conductor 204 is electrically coupled to the ground terminal while the second electrical conductor 214 is electrically coupled to the power terminal. The above-described relates to a single power delivery system, but it is to be understood that multiple power delivery system are possible (see FIGS. 6A to 6B and 7A to 7B which will be described in later paragraphs).

In FIGS. 2A and 2B, the second electrical conductor 214 is illustrated as having an L-shape cross-section with a horizontal portion of the L-shape arranged to provide a barrier support to an underfill material 210 of the semiconductor die 208. It is to be understood that other suitable cross-sectional shapes including, but not limited to, rectangle, square and triangle, may be used. The shape of the second electrical conductor 214 should be appropriately selected to allow secure installation of at least one die-side component 206 in the socket 216 and to allow the component 206 maintain electrical contact with the first and the second electrical conductors 204, 214. This way, the die-side component 206 does not require a solder attachment at an interface between the component 206 and the substrate 202 for installation. Since the interface between the die-side component 206 and the substrate 202 is substantially free of a solder material, the component 206 may be removed from the socket 216 manually or using an automatic tool as and when required. With the capability to easily install and remove die-side components 206 from the socket 216, the number of components 206 e.g. capacitors required for power delivery to the semiconductor die 208, can be modified by simply inserting or removing capacitors from the socket 216.

In embodiments of the invention, the socket 216 formed by the first and the second electrical conductors 204, 214 allow placement and installation of at least one die-side component 206 along any portion of the socket 216. A higher density of die-side components 206 per package area can therefore be achieved since no solder is required to couple the components 206 to the substrate 202. This in turn improves the potential to reduce package size and overall package costs. More particularly, a distance ($YY_1$) between the semiconductor die 208 and the first electrical conductor 204 (package stiffener) can be reduced which reduces package size ($YY_2$).

In FIGS. 2A and 2B, the second electrical conductor 214 and an underfill material 210 of the semiconductor die 208 are disposed in contact. The second electrical conductor 214 may act as a reservoir to contain the underfill material 210 and to prevent it from spreading over a larger area on the substrate 102. This way, a reduced distance ($YY_1$) between the die 208 and second electrical conductor 214 can be achieved as compared to the conventional package illustrated in FIG. 1. In certain other embodiments, the second electrical conductor may be spaced apart from the underfill material 210.

Figure 3:
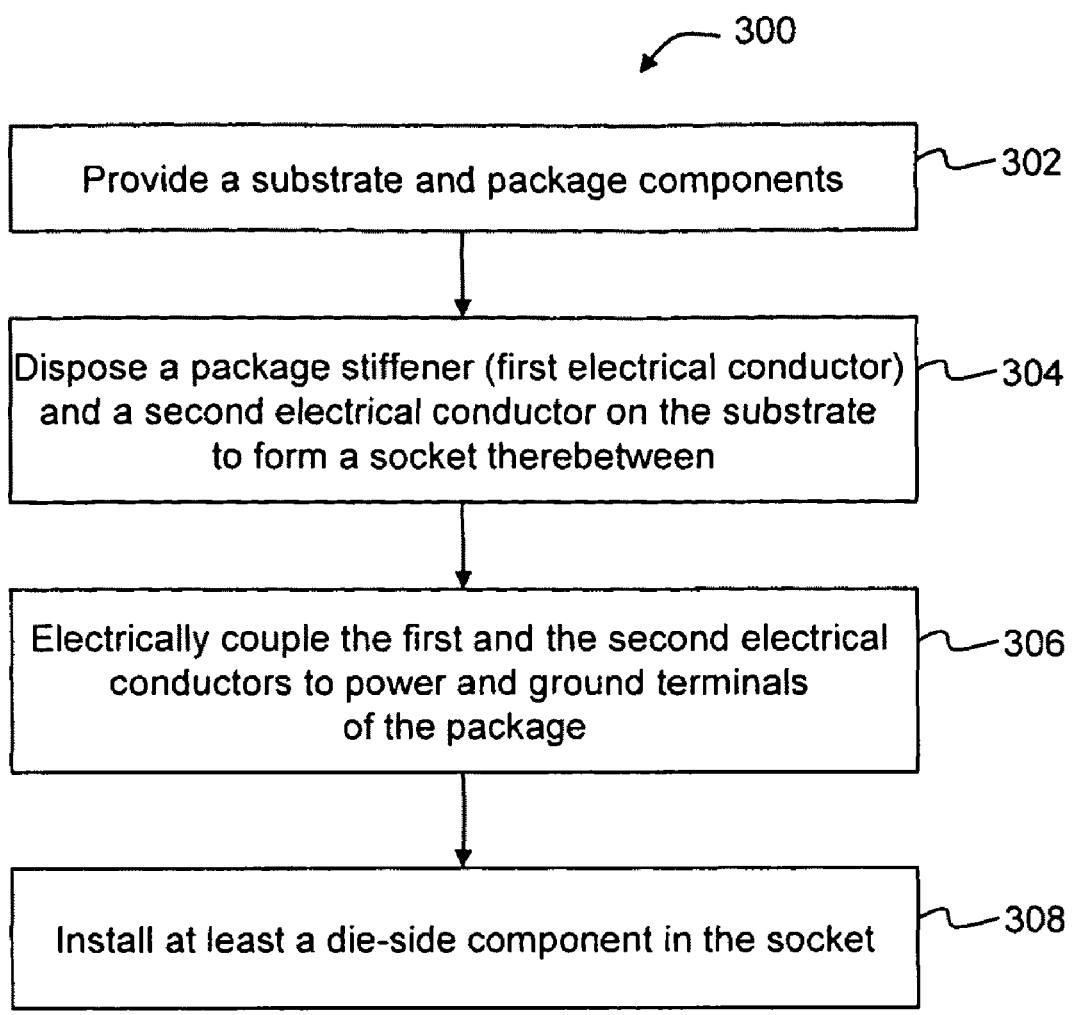
FIG. 3 is a process sequence for fabricating the semiconductor package of FIGS. 2A to 2B according to one embodiment of the invention.
Figure 4:
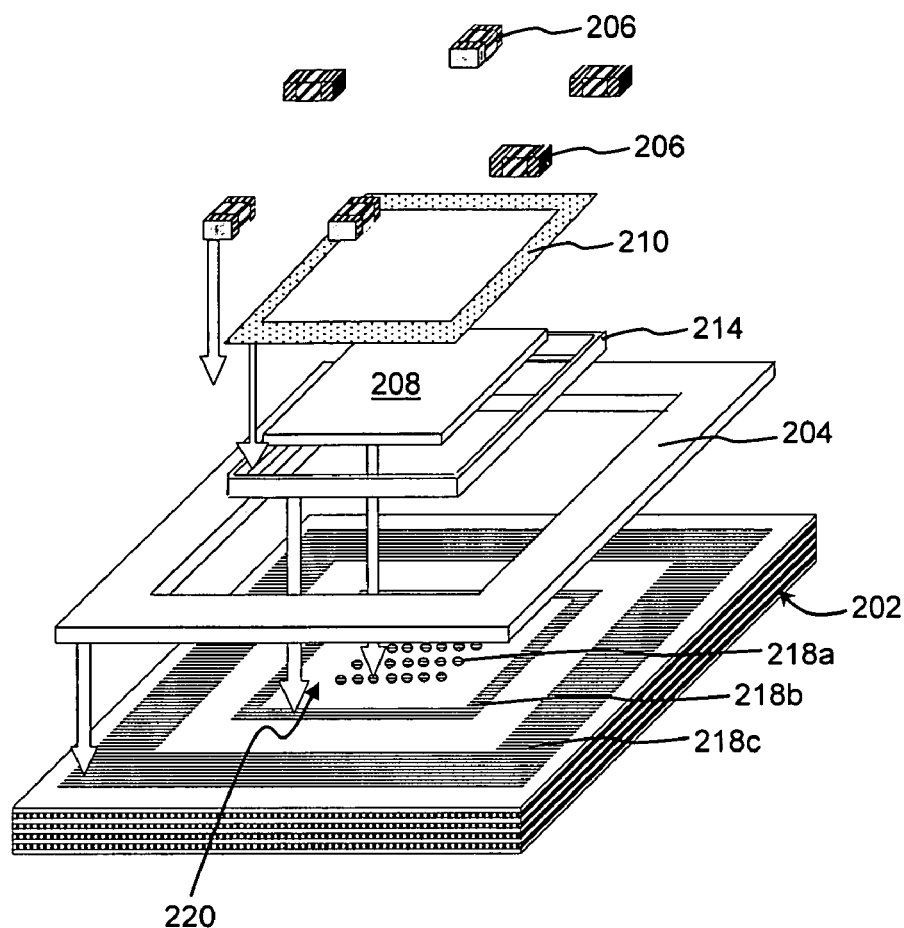
FIG. 4 illustrates various components used in the process sequence of FIG. 3.

FIG. 3 is a flow chart summarizing a process sequence 300 of fabricating a semiconductor package 200 according to one embodiment of the invention. While the process sequence 300 is described with reference to a flip chip package, it is to be understood that embodiments of the invention are applicable to other types of semiconductor packages 200 with suitable modifications. The process sequence 300 will be described with further reference to FIG. 4 illustrating various components of the package 200 of FIG. 3.

The process sequence 300 begins with providing a coreless substrate 202 and various package components (block 302). A coreless substrate 202 generally refers to an arrangement of a plurality of build-up layers without a reinforcing core layer interposed between the layers. The coreless substrate 202 may be fabricated using known substrate fabrication process. Solder resist openings (SRO) 218a-218c may be formed in the substrate 202 as shown in FIG. 4. The openings 218a-218c are provided for mounting and electrically coupling the semiconductor die 208, the first electrical conductor 204 and the second electrical conductor 214 to the substrate 202. The first and second electrical conductors 204, 214 may be provided with pre-solder on appropriate surfaces which are to be interfaced with the substrate 202. Solder paste may be applied onto the substrate 202 around the openings 218a-218c by known methods, such as a stencil or equivalent process, in preparation to mount the various package components on the substrate 202.

The process sequence 300 proceeds to disposing or placing a package stiffener 204 (first electrical conductor) and a second electrical conductor 214 on the substrate 202 to form a socket 216 therebetween (block 304). A pick-and place tool may be employed to dispose a first electrical conductor 204 (package stiffener), followed by the second electrical conductor 214 and subsequently the semiconductor die 208 at designated positions on the substrate 202. However, it is to be understood that the placement sequence of the first electrical conductor 204 and the second electrical conductor 214 may be interchanged. It is also to be understood that placement of the semiconductor die 208 at a die-mounting zone 220 should proceed after placement of the first and the second electrical conductors 204, 214 due to difficulties in re-attaching the die 208. FIG. 4 illustrates a coreless substrate 202 having a plurality of solder resist openings 218a-218c arranged to receive various package components. FIG. 4 also illustrates the placement of the semiconductor die 208, the first and the second electrical conductors 204, 214 at their designated positions.

The process sequence 300 then proceeds to electrically coupling the first and the second electrical conductors 204, 214 to power and ground terminals of the package 200 (block 306). The coreless substrate 202 and various package components placed thereon are subject to a reflow process during which a solder is melted to electrically couple the components to the substrate 202, and more particularly to the power and ground terminals of the package 200. The reflow process may be followed by a cleaning process to remove solder residues. An underfill material 210, e.g. epoxy, may be provided between the die 206 and the substrate 202 to provide mechanical support to the die 206 and to protect the die 206 from the ambient environment.

The process sequence 300 may then proceed to installing at least a die-side component 206 in the socket 216 (block 308). Examples of die-side components include, but are not limited to, capacitors, inductors, resistors and voltage regulators. Depending on applications and requirements, one or more types of die-side components may be used. The die-side component 206 may be installed by inserting the component into the socket 216 by a manual or an automatic pick-and-place tool. Once installed, the die-side component 206 is maintained in electrical contact with the first and the second electrical conductors 204, 214. Placement of the die-side components 206 may be at any portion along the socket 216. Since a solder material is not required to install the die-side component 206, the component 206 may be installed and removed easily from the socket 216.

Embodiments of the invention allow easy installation and removal of die-side components 206 from a substrate 202 since a solder material is not required to mount the components 206. The easy installation and removal of components 206 from the socket 216 may be useful during product validation to determine the optimized capacitance required to achieve certain product performance, and yet without requiring reflowing and unsoldering. In applications requiring die-side capacitors, a higher density of capacitors per package area can also be achieved with the socket arrangement, which increases the potential for higher die-side capacitance. This in turn eliminates a need to increase on-die decoupling capacitance and therefore reduces package costs as lesser silicon area is required.

Variations to the above embodiments of the invention may be envisaged and certain embodiments are described as follows for illustrative purposes.

Figure 5:
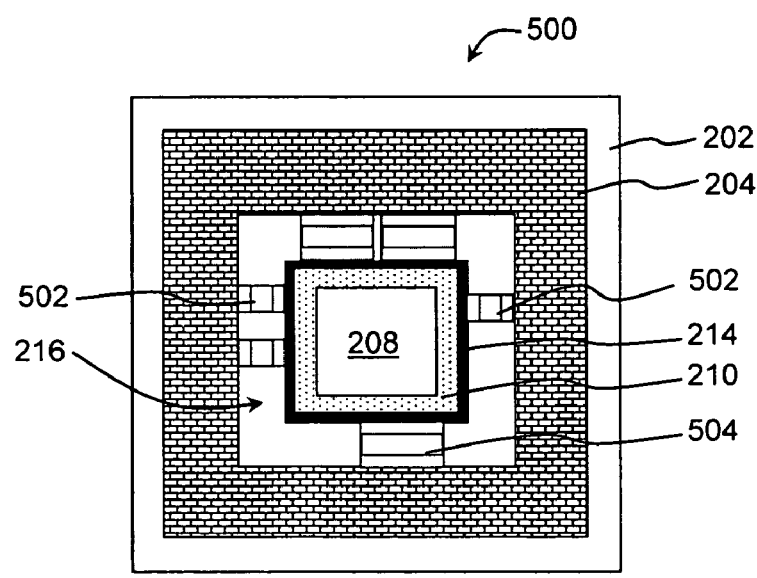
FIG. 5 is a top view of a semiconductor package having die-side components of different dimensions according to one embodiment of the invention.

Embodiments of the inventions are suitable in applications where installation of die-side components of similar or different sizes is required. In the embodiment of FIGS. 2A and 2B, socket dimensions, i.e. a distance between the first and the second electrical conductor 204, 214, may be substantially constant along the perimeters of the conductors 204, 214 to accommodate die-side components 206 of similar dimensions. In the embodiment of FIG. 5, socket dimensions may be varied to accommodate various component sizes or orientations. In FIG. 5, a semiconductor package 500 having die-side components of different dimensions is illustrated. More particularly, a typical two-terminal multi-layer ceramic capacitor 502 and a reverse geometry two-terminal multi-layer ceramic capacitor 504 have different dimensions between their terminals and would therefore require different socket dimensions.

Figure 6A:
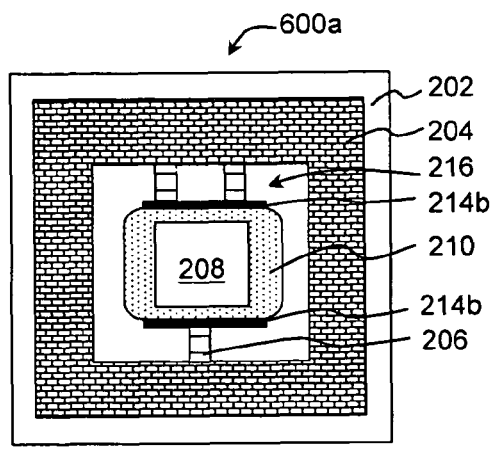
FIGS. 6A and 6B are top views of semiconductor packages having multiple power delivery systems.
Figure 6B:
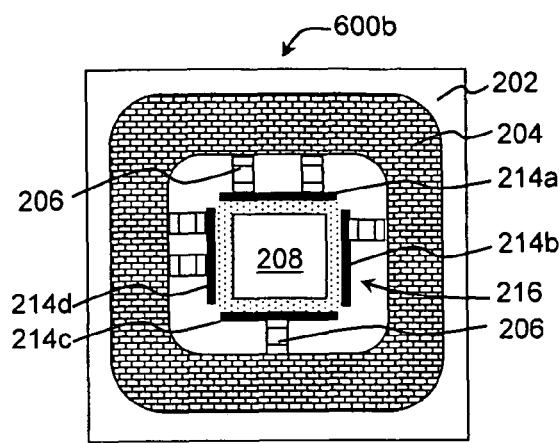

Embodiments of the inventions are suitable in applications where more than one power delivery system is required. FIGS. 6A and 6B illustrate examples in which the semiconductor packages 600a, 600b have two and four power delivery systems respectively. In the embodiment of FIG. 6A, the first electrical conductor 204 is designated as the ground terminal ($V_{ss}$). The second electrical conductor 214 is provided as two electrically-separate portions in which a first portion 214a is coupled to a first power terminal ($V_{CCA}$) and the second portion 214b is coupled to a second power terminal ($V_{CCB}$). In the embodiment of FIG. 6B, the first electrical conductor 204 is coupled to the ground terminal ($V_{ss}$). The second electrical conductor is provided as four electrically-separate portions in which a first portion 214a is coupled to a first power terminal ($V_{CCA}$), the second portion 214b is coupled to a second power terminal ($V_{CCB}$), the third portion 214c is coupled to a third power terminal ($V_{CCC}$), and the fourth portion 214d is coupled to a fourth power terminal ($V_{CCD}$).

Figure 7A:
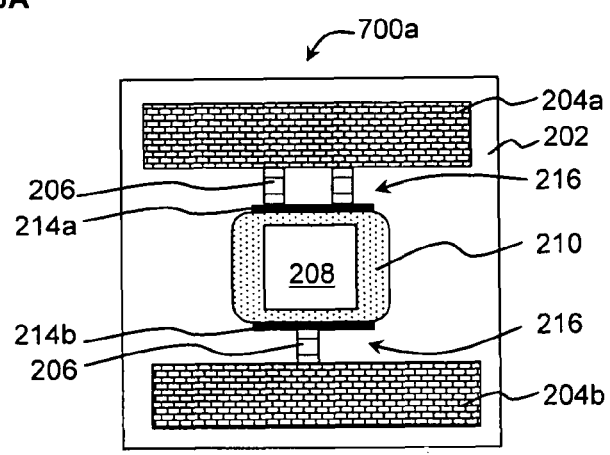
FIGS. 7A to 7C are top views of semiconductor packages having various die and stiffener configurations.
Figure 7B:
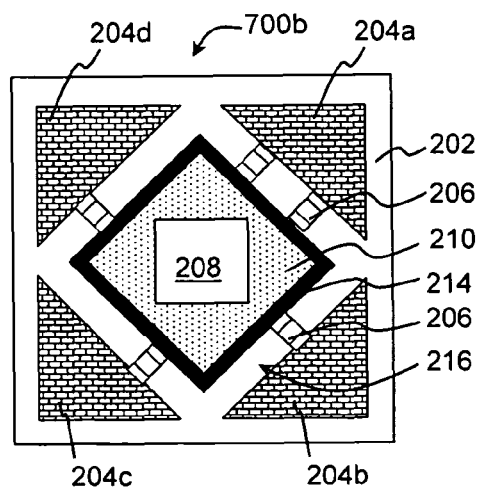
Figure 7C:
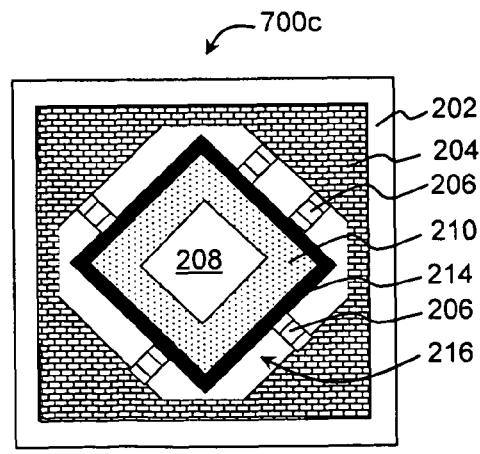

Various die and stiffener configurations are possible in embodiments of the invention. FIGS. 6B, 7A to 7C illustrate a few examples for illustrative purposes. In the embodiment 700a of FIG. 7A, the first electrical conductor 204 as well as the second electrical conductor 214 are provided as two electrically-separate and spaced apart portions 204a, 204b. In the embodiment 700b of FIG. 7B, the first electrical conductor 204 is provided as four separate spaced apart portions 204a, 204b, 204c, 204d spaced apart while the second electrical conductor 214 is provided as a single portion enclosing the semiconductor die. In the embodiment of FIG. 7C, the first electrical conductor 204 as well as the second electrical conductor 214 are provided as a single portion. The semiconductor die 208 is arranged in a rotated configuration.

Other embodiments will be apparent to those skilled in the art from consideration of the specification and practice of the invention. Furthermore, certain terminology has been used for the purposes of descriptive clarity, and not to limit the invention. The embodiments and features described above should be considered exemplary, with the invention being defined by the appended claims.

What is claimed is:

1. A semiconductor package comprising:
a coreless substrate having a die-mounting zone;
a die disposed in the die-mounting zone;
a first electrical conductor mounted along a perimeter of the coreless substrate to provide stiffening support to the coreless substrate; and
a second electrical conductor mounted on the coreless substrate and spaced apart from the first electrical conductor to form a socket between the first electrical conductor and the second electrical conductor,
wherein the first and the second electrical conductor are coupled to a power terminal and a ground terminal to supply electrical power to at least a die-side component installed in the socket; and
an underfill material disposed in contact with the second electrical conductor, and wherein the die-side component is substantially free of solder at an interface between the die-side component and the coreless substrate.

2. The semiconductor package of claim 1, wherein the die-side component is one of a capacitor, an inductor, a resistor, and a voltage regulator.

3. The semiconductor package of claim 1, wherein the die-side component includes at least three of a capacitor, an inductor, a resistor, and a voltage regulator.

4. The semiconductor package of claim 1, wherein the die-side component is substantially free of a solder at an interface between the die-side component and the substrate.

5. The semiconductor package of claim 1, wherein the second electrical conductor is interposed between the first electrical conductor and the die-mounting zone.

6. The semiconductor package of claim 1, wherein the first and the second electrical conductor are electrically coupled to the substrate by a solder.

7. A semiconductor package comprising:
a coreless substrate having a die-mounting zone;
a die disposed in the die-mounting zone;
a first electrical conductor mounted along a perimeter of the coreless substrate to provide stiffening support to the coreless substrate; and
a second electrical conductor mounted on the coreless substrate and spaced apart from the first electrical conductor to form a socket between the first electrical conductor and the second electrical conductor,
wherein the first and the second electrical conductor are coupled to a power terminal and a ground terminal to supply electrical power to at least a die-side component installed in the socket; and
an underfill material disposed in contact with the second electrical conductor, wherein the second electrical conductor provides a barrier support to the underfill material, and wherein the die-side component is substantially free of solder at an interface between the die-side component and the coreless substrate.

8. The semiconductor package of claim 6, wherein the first electrical conductor is coupled to a power terminal and the second electrical conductor is coupled to a ground terminal.

9. The semiconductor package of claim 6, wherein the die-side component includes at least three of a capacitor, an inductor, a resistor, and a voltage regulator.

10. The semiconductor package of claim 6, wherein the first electrical conductor is coupled to a ground terminal, and the second electrical conductor is provided as electrically-separate portions which are coupled to a plurality of power terminals, and wherein the die-side component includes at least three of a capacitor, an inductor, a resistor, and a voltage regulator.

* * * * *